United States Patent [19]

Levy

[11] Patent Number: 5,879,739
[45] Date of Patent: Mar. 9, 1999

[54] BATCH PROCESS FOR FORMING METAL PLUGS IN A DIELECTRIC LAYER OF A SEMICONDUCTOR WAFER

[75] Inventor: Jeff Levy, Moshav Netofah, Israel

[73] Assignee: Tower Semiconductor Ltd., Migdal Haemek, Israel

[21] Appl. No.: 803,468

[22] Filed: Feb. 20, 1997

[51] Int. Cl.⁶ ...................................................... B05D 5/12
[52] U.S. Cl. .......................... 427/97; 427/350; 427/126.1; 438/908
[58] Field of Search ............................... 427/97, 350, 369, 427/379, 126.1; 204/298.25; 437/194, 197; 29/25.01; 438/908, 637

[56] References Cited

U.S. PATENT DOCUMENTS 4,951,601  8/1990  Maydan et al. ..................... 204/298.25
5,019,234  5/1991  Harper ................................ 204/192.17

OTHER PUBLICATIONS

Shterenfeld–Lavie et al, "A 3–Level 0.35μm interconnection process using an innovative, high pressure aluminium plug technology", Twelfth International VLSI Multilevel Interconnection Conference, Jun., 1995, Session II, Paper C.

*Primary Examiner*—Brian K. Talbot
*Attorney, Agent, or Firm*—Mark M. Friedman

[57] ABSTRACT

A batch process for the high-pressure forming of metal plugs in the dielectric layers of semiconductor wafers. After holes are etched in the dielectric layer of each wafer, and a layer of a metal such as aluminum deposited over the dielectric, both the etching and the deposition being done in vacuum chamber cluster machines, the wafers are removed from the cluster machines and placed together in a high pressure chamber where they are subjected to high isostatic pressure that forces the metal into the holes.

8 Claims, 2 Drawing Sheets

BATCH PROCESS FOR FORMING METAL PLUGS IN A DIELECTRIC LAYER OF A SEMICONDUCTOR WAFER

FIELD AND BACKGROUND OF THE INVENTION

The present invention relates to the processing of semiconductor wafers and, more particularly, to a batch process for forming metal plugs in dielectric layers of semiconductor wafers.

The prior art process, of which the present invention is an improvement, is described in "A 3-Level, 0.35 μm interconnection process using an innovative, high pressure aluminum plug technology" (Z. Shterenfeld-Lavie, I. Rabinovich, J. Levy, A. Haim, C. Dobson, K. Buchanan, P. Rich and D. J. Thomas, Twelfth International VLSI Multilevel Interconnection Conference, Jun. 27–29, 1995, Session II Paper C), which is incorporated by reference for all purposes as if fully set forth herein. Briefly, holes for contacts and vias are etched in a dielectric layer on a semiconductor wafer; a layer of soft metal, typically aluminum, at least as thick as the holes are wide is deposited above the holes, typically by sputtering; and external isostatic pressure is applied to the wafer to force the metal into the holes. According to the prior art process, all of these steps are performed in vacuum chamber cluster machines such as the one shown schematically in FIG. 1.

The particular configuration of a vacuum chamber cluster machine 10 shown in FIG. 1 is used for the deposition and external pressure steps. Cluster machine 10 includes a central hexagonal dealer 12 to which are attached three vacuum chambers 14, 14' and 14", a high pressure chamber 16, and two vacuum cassette handlers 18. The machine is controlled by a control system 20. Vacuum cassettes holding semiconductor wafers are introduced to cluster machine 10 and removed from cluster machine 10 via vacuum cassette handlers 18, and moved counterclockwise from chamber to chamber for processing by dealer 12. In vacuum chamber 14, the wafer is preheated to 450° C. to outgas it, and a soft sputter etch precleaning is performed to clean the surface of the dielectric layer. In vacuum chamber 14', a 200 Å layer of titanium and a 500 Å layer of titanium nitride are deposited. In vacuum chamber 14", the aluminum layer is deposited. In high pressure chamber 16, the wafer is heated to about 430° C. and an inert gas such as argon, under a pressure of 700 atmospheres, forces the aluminum into the holes previously etched in the dielectric layer below. Finally, the wafer is returned to vacuum chamber 14' and a 450 Å layer of titanium nitride is deposited as an anti-reflective coating.

This prior art process suffers from certain inefficiencies associated with the need to operate under both vacuum and high pressure conditions within the same machine. The cluster machine of FIG. 1 processes one wafer at a time, and most of the time is spent raising and lowering the pressure of chamber 16, not actually processing the wafer. In addition, the design and construction of cluster machine 10 is significantly more complex than the design and construction of cluster machines that do not mix vacuum chambers and high pressure chambers, reflecting the special requirements associated with safely cycling between vacuum and high pressure every few minutes.

There is thus a widely recognized need for, and it would be highly advantageous to have, a method, of forming metal plugs in dielectric layers of semiconductor wafers by external pressure, that is more efficient and safer than the presently known methods.

SUMMARY OF THE INVENTION

According to the present invention there is provided an improved process for forming metal plugs in a dielectric layer of at least one semiconductor wafer, at least one hole being etched in the dielectric layer, a layer of the metal being deposited over the at least one hole, and external pressure being applied to the layer of metal, the etching and the deposition being effected in a vacuum chamber cluster machine, the improvement consisting of the step of: (a) removing the at least one wafer from the cluster machine, prior to applying the external pressure.

According to the present invention there is provided an improved process for forming metal plugs in the dielectric layers of a plurality of semiconductor wafers, at least one hole being etched in each of the dielectric layers, a layer of the metal being deposited over the at least one hole, and external pressure being applied to the layer of metal, the improvement comprising the steps of: (a) providing a high pressure chamber; and (b) placing the plurality of wafers inside the high pressure chamber; the application of external pressure being effected within the high pressure chamber.

Surprisingly, it has been found that the application of pressure to the wafer, to force the metal into the dielectric layer, may be performed successfully after the deposition of the titanium nitride anti-reflective coating. According to the present invention, the step of applying isostatic pressure to the wafer is performed, not in a vacuum chamber cluster machine such as cluster machine 10, but in a separate high pressure chamber. After the deposition of the aluminum layer in vacuum chamber 14", a layer of titanium nitride, having a thickness between about 200 Å and about 400 Å, is deposited above the aluminum layer in vacuum chamber 14'. This layer of titanium nitride serves as the anti-reflective coating, and also serves to protect the aluminum layer from oxidation when the wafer is removed from the cluster machine. The wafer is removed from the cluster machine after the deposition of the aluminum layer and placed in the high pressure chamber. An inert gas under high pressure is pumped into the high pressure chamber long enough to force the aluminum into the holes in the underlying dielectric layer. The high pressure is released, and the wafer is removed from the chamber.

The wafer now may be returned to the same cluster machine, or to a different cluster machine, for further processing under vacuum. Because the aluminum layer has already been covered with titanium nitride before the application of high pressure, however, the wafer need not be returned to a vacuum chamber at this point, but may be subjected immediately to further conventional processing steps, such as photolithography, that are performed at atmospheric pressure.

One high pressure chamber serves several cluster machines, processing several (from 6 to 100) wafers at a time, so that the pressure is cycled up and down for several wafers simultaneously instead of separately for each wafer. It is in this sense that the present invention is a batch process.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a batch process for the high-pressure forming of metal plugs in the dielectric layers of semiconductor wafers.

The principles and operation of high-pressure batch processing of semiconductor wafers according to the present invention may be better understood with reference to the drawings and the accompanying description.

Figure 1:
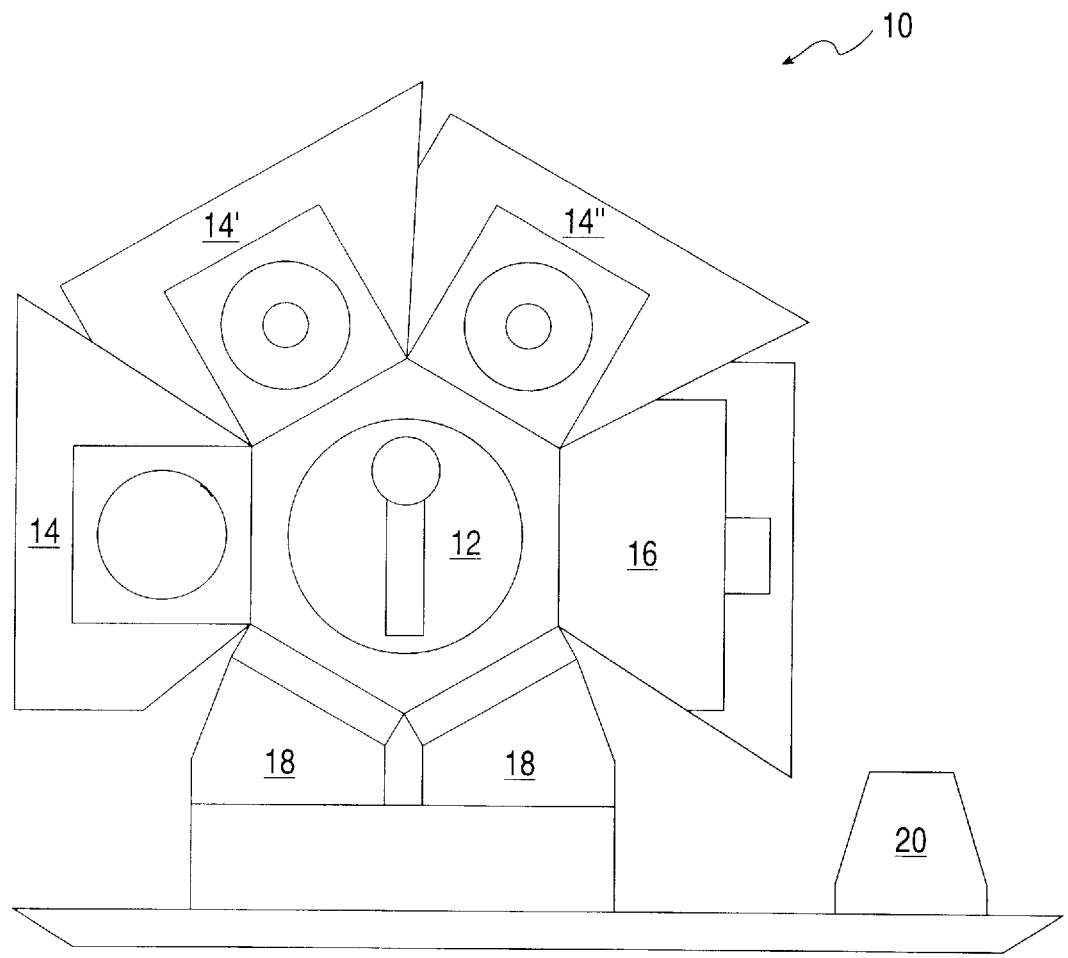
FIG. 1 (prior art) is a schematic plan view of a vacuum chamber cluster machine.
Figure 2:
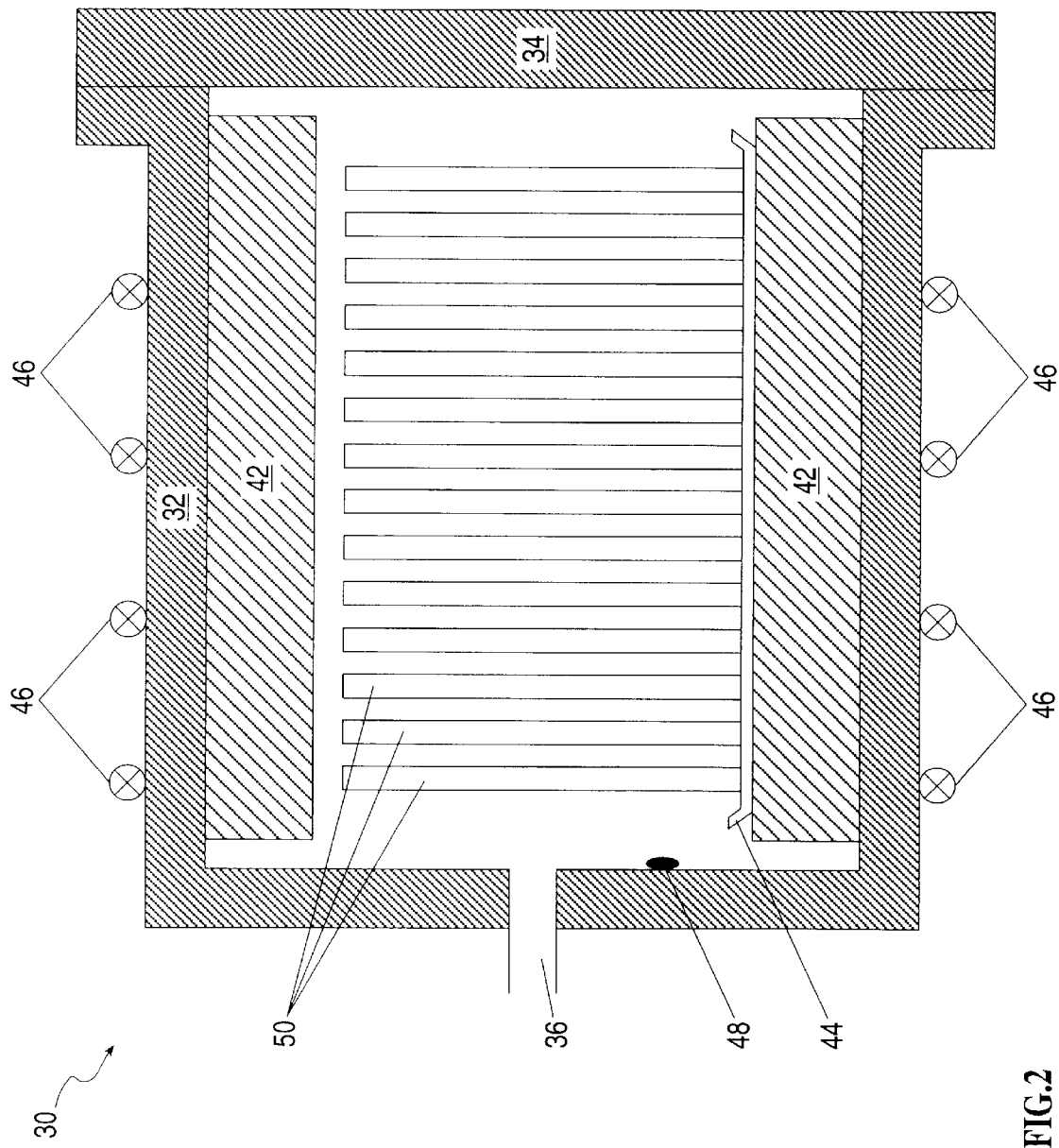
FIG. 2 is a schematic cross sectional view of a high pressure chamber of the present invention.

Referring now to the drawings, FIG. 2 is a schematic cross-sectional view of a high-pressure chamber 30 used in conjunction with the method of the present invention. Chamber 30 consists of a hollow flanged stainless steel cylinder 32 that is sealed at one end and provided with an inlet/outlet pipe 36 for the inert gas. Preferably, cylinder 32 has an inner diameter of between about 200 millimeters and about 300 millimeters. A high pressure door 34 is provided at the open end of cylinder 32 for sealing in the inert gas introduced via pipe 36 at high pressure. An annular metal liner 42 having an outer diameter equal to the inner diameter of cylinder 32 is provided to allow chamber 30 to accommodate wafers of a smaller diameter than cylinder 32 with minimal dead space. Heating elements 46 are provided external to cylinder 32 for heating chamber 30. These heating elements may be resistive heaters, as shown, or a heated liquid bath. A thermocouple 48 is provided on the back wall of cylinder 32 for monitoring the temperature inside chamber 30. Pressure is monitored by a standard high pressure gauge (not shown) connected to pipe 36.

A boat 44 is shown holding 14 semiconductor wafers, 3 of which are designated by the reference numeral "50", inside chamber 30. Wafers 50 are standing on their edges in boat 44, thereby further reducing the dead space within chamber 30.

In use, several semiconductor wafers 50, from several vacuum chamber cluster machines, are placed on their edges in boat 44, and boat 44 is placed inside chamber 30, as shown. Door 34 is sealed, and argon gas is pumped into chamber 30 via pipe 36 until the pressure inside chamber 30 reaches the desired 700 atmospheres, while chamber 30 is heated to a temperature of about 430° C. by heating elements 46. This temperature and pressure is maintained for at least about 30 seconds, after which the temperature and pressure are reduced to ambient levels and wafers 50 either are returned to the vacuum chamber cluster machines for further processing under vacuum, or are processed further under atmospheric pressure.

While the invention has been described with respect to a limited number of embodiments, it will be appreciated that many variations, modifications and other applications of the invention may be made.

What is claimed is:

1. An improved process for forming metal plugs in a dielectric layer of at least one semiconductor wafer, at least one hole being etched in the dielectric layer, a layer of the metal being deposited over the at least one hole, the etching and the deposition being effected in a vacuum chamber cluster machine, the improvement comprising:

(a) providing a pressure chamber separate from the vacuum chamber cluster machine;

(b) removing the at least one wafer from the cluster machine to an oxidizing environment;

(c) placing the at least one wafer inside said pressure chamber subsequent to said removal of said at least one wafer to said oxidizing environment; and (d) applying external pressure to the at least one wafer within said pressure chamber.

2. The process of claim 1, further comprising:

(e) depositing a layer of titanium nitride on the layer of metal, prior to applying the external pressure.

3. The process of claim 2, wherein said depositing of said layer of titanium nitride is effected prior to said removing of the at least one wafer from the cluster machine.

4. The process of claim 1, further comprising:

(e) returning the at least one wafer to the cluster machine, subsequent to applying the external pressure.

5. The process of claim 1, wherein said application of external pressure is effected for at least about 30 seconds.

6. The process of claim 1, further comprising:

(e) providing a boat; and (f) standing the at least one wafer on an edge thereof in said boat; said placing of the at least one wafer inside said pressure chamber being effected by placing said boat inside said pressure chamber.

7. The process of claim 1, wherein said pressure chamber includes a liner.

8. The process of claim 1, wherein said pressure chamber includes at least one external heating element, selected from the group consisting of resistive heaters and liquid baths, whereby said pressure chamber is heated.

* * * * *